(12) United States Patent
Taguchi

(10) Patent No.: US 8,014,199 B2
(45) Date of Patent: Sep. 6, 2011

(54) MEMORY SYSTEM WITH SWITCH ELEMENT

(75) Inventor: Masao Taguchi, Tokyo (JP)

(73) Assignee: Spansion LLC, Sunnyvale, CA (US)

( * ) Notice: Subject to any disclaimer, the term of this patent is extended or adjusted under 35 U.S.C. 154(b) by 387 days.

(21) Appl. No.: 11/419,705

(22) Filed: May 22, 2006

(65) Prior Publication Data

US 2007/0268744 A1    Nov. 22, 2007

(51) Int. Cl.
*G11C 14/00* (2006.01)
(52) U.S. Cl. ......... 365/185.08; 365/185.05; 365/185.17; 365/149; 365/163
(58) Field of Classification Search ......... 365/185.05 X, 365/185.08 O, 185.17 X, 149 X, 163 X, 185.01, 365/185.05, 185.08, 185.17, 149, 163
See application file for complete search history.

(56) References Cited

U.S. PATENT DOCUMENTS

| | | | |
|---|---|---|---|
| 4,090,254 A | 5/1978 | Ho et al. | |
| 4,126,899 A | 11/1978 | Lohstroh et al. | |
| 4,612,629 A | 9/1986 | Harari | |
| 4,791,611 A | 12/1988 | Eldin et al. | |
| 4,888,630 A * | 12/1989 | Paterson | 365/185.24 |
| 5,546,341 A * | 8/1996 | Suh et al. | 365/185.33 |
| 5,808,935 A * | 9/1998 | Kwon et al. | 365/185.17 |
| 5,981,335 A * | 11/1999 | Chi | 438/253 |
| 5,998,264 A | 12/1999 | Wu | |
| 6,785,155 B2 * | 8/2004 | Matsushita | 365/145 |
| 6,982,205 B2 | 1/2006 | Joo et al. | |
| 7,099,192 B2 * | 8/2006 | Wang et al. | 365/185.1 |
| 7,251,152 B2 * | 7/2007 | Roehr | 365/100 |
| 2005/0018526 A1 * | 1/2005 | Lee | 365/232 |
| 2005/0174835 A1 | 8/2005 | Rinerson et al. | |
| 2006/0019460 A1 | 1/2006 | Phan et al. | |
| 2006/0024899 A1 | 2/2006 | Crenshaw et al. | |
| 2007/0253242 A1 * | 11/2007 | Parkinson et al. | 365/163 |

FOREIGN PATENT DOCUMENTS

| | | |
|---|---|---|
| DE | 2445078 A1 | 4/1976 |
| JP | 05129559 | 5/1993 |

* cited by examiner

*Primary Examiner* — VanThu Nguyen
(74) *Attorney, Agent, or Firm* — Mikio Ishimaru

(57) ABSTRACT

A memory system is provided forming a switch element having a first side and a second side, forming a cell transistor having a gate terminal, forming a memory cell, having the switch element and the cell transistor, with the gate terminal connected to the second side, connecting a word line and the memory cell at the first side, connecting a bit line and the memory cell, and connecting a reference source and the memory cell.

26 Claims, 7 Drawing Sheets

MEMORY SYSTEM WITH SWITCH ELEMENT

TECHNICAL FIELD

The present invention relates generally to memory system and more particularly to non-volatile memory system.

BACKGROUND ART

Modern electronics, such as smart phones, personal digital assistants, location based services devices, digital cameras, music players, servers, and storage arrays, are packing more integrated circuits into an ever shrinking physical space with expectations for decreasing cost. One cornerstone for electronics to continue proliferation into everyday life is the non-volatile storage of information such as cellular phone numbers, digital pictures, or music files. Numerous technologies have been developed to meet these requirements.

Moreover, in the coming years, electronic systems, especially portable systems, will demand even more nonvolatile memory with high density and very high writing throughput for data storage application as well as fast random access for code execution. The flexibility and cost make the non-volatile memory a widely utilized and mature technology for most non-volatile applications.

Various types of memories have been developed in the past as electronic memory media for computers and similar systems. Such memories include electrically erasable programmable read only memory (EEPROM) and electrically programmable read only memory (EPROM). Each type of memory had advantages and disadvantages. EEPROM can be easily erased without extra exterior equipment but with reduced data storage density, lower speed, and higher cost. EPROM, in contrast, is less expensive and has greater density but lacks erasability.

A newer type of memory called "Flash" EEPROM, or Flash memory, has become extremely popular because it combines the advantages of the high density and low cost of EPROM with the electrical erasability of EEPROM. Flash memory can be rewritten and can hold its contents without power.

In Flash memory, bits of information are programmed individually as in the older types of memory, such as dynamic random access memory (DRAM) and static random access memory (SRAM) memory chips. However, in DRAMs and SRAMs where individual bits can be erased one at a time, Flash memory must currently be erased in fixed multi-bit blocks or sectors.

One popular and low-cost non-volatile memory is called "NAND" memory which is partly distinguished from other non-volatile memories because of the series connection configuration of the memory cells. Typical NAND memory is good for data storage applications but not well suited for fast random access needed for program code storage.

NAND memory uses the Fowler-Nordheim tunneling current. Programming data to the NAND memory requires high voltage, such as at least 15 volts or typically 18 volts, to store charge in the floating gate. This high voltage requirement does not scale well to smaller semiconductor geometries. The smaller and thinner physical features in the smaller semiconductor geometry process cannot reliably tolerate the high voltage levels. These additional constraints adversely impact memory density, function, performance, cost, and reliability.

Other memory approaches uses a metal-insulator-metal (MIM) structure as part of the overall memory structure. The MIM element turns on and off figuratively analogous to a mechanical switch, as the applied voltage changes and information from the MIM type memory is derived by sensing current through the MIM element. Typically, MIM type memories store data in a manner defined by the "on" or "off" state of the MIM element. Thus, the MIM element is often referred to as a MIM switch cell serving as a current switch.

In a memory array utilizing the MIM switch cell, transistors, such as a metal oxide semiconductor field effect transistor (MOSFET), serve as a transfer gate allowing access to particular portions of the memory array. Typically, the MOSFETs are connected in series to MIM switch cells as in dynamic random access memory (DRAM) type cells. However, today's technology requires approximately 100 $\mu$A to program or erase the MIM switch cell. The current required may be as low as 10 $\mu$A depending on the material used for the MIM switch cell but generally more current is necessary. Thus, the MOSFET must be designed large enough to conduct the current creating a large cell size, causing a reduction in memory density.

Resistance changing memories, including MIM memory and phase change memory, require a relatively large current to switch the memory element. This requires relatively large size switch transistors, MOSFET, in the memory cell making cell size large. Resistance changing memories pass the read current through the switching cell. This causes so called "read disturb" to destroy the stored data as it operates.

Thus, a need still remains for a memory system providing low cost manufacturing, improved yields, and reduced memory cost. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides a memory system including forming a switch element having a first side and a second side, forming a cell transistor having a gate terminal, forming a memory cell, having the switch element and the cell transistor, with the gate terminal connected to the second side, connecting a word line and the memory cell at the first side, connecting a bit line and the memory cell, and connecting a reference source and the memory cell.

Certain embodiments of the invention have other aspects in addition to or in place of those mentioned or are obvious from the above. The aspects will become apparent to those skilled in the art from a reading of the following detailed description when taken with reference to the accompanying drawings.

BEST MODE FOR CARRYING OUT THE INVENTION

Figure 1:
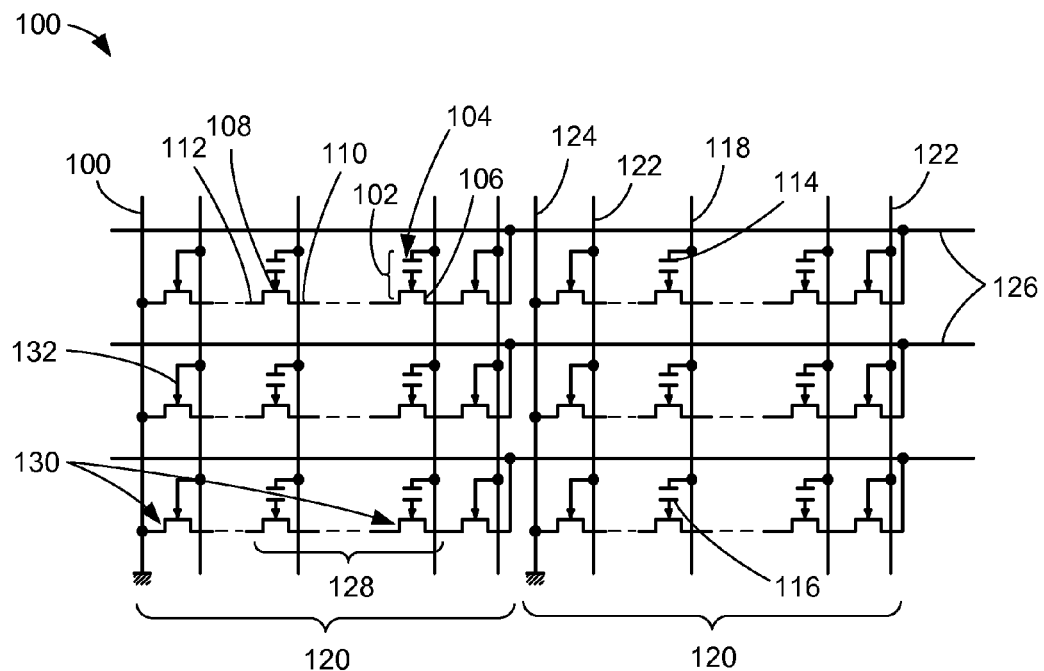
FIG. 1 is a schematic view of a memory system in an embodiment of the present invention.

In the following description, numerous specific details are given to provide a thorough understanding of the invention. However, it will be apparent that the invention may be practiced without these specific details. In order to avoid obscuring the present invention, some well-known system configurations, and process steps are not disclosed in detail. Likewise, the drawings showing embodiments of the apparatus are semi-diagrammatic and not to scale and, particularly, some of the dimensions are for the clarity of presentation and are shown greatly exaggerated in the figures. In addition, where multiple embodiments are disclosed and described having some features in common, for clarity and ease of illustration, description, and comprehension thereof, similar and like features one to another will ordinarily be described with like reference numerals.

The term "horizontal" as used herein is defined as a plane parallel to the conventional integrated circuit surface, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means there is direct contact among elements.

The term "processing" as used herein includes deposition of material, patterning, exposure, development, etching, cleaning, molding, and/or removal of the material or as required in forming a described structure.

Referring now to FIG. 1, therein is shown a schematic view of a memory system 100 in an embodiment of the present invention. The memory system 100 includes memory cells 102 in an array configuration. Each of the memory cells 102 includes a switch element 104, such as a metal-insulator-metal (MIM) switch cell or a phase change switch cell, and a cell transistor 106, such as a junction field effect transistor (JFET). The cell transistor 106 includes a gate terminal 108, a drain terminal 110, and a source terminal 112.

The switch element 104 may be a MIM switch cell made from a number of possible materials, such as copper oxide ($Cu_xO$), nickel oxide (NiO), tantalum oxide ($Ta_2O_5$), or titanium oxide ($TiO_2$), between conductive plates, such as metals or alloys. The switch element 104 may alternatively be a phase change switch cell made from a number of possible materials, such as germanium selenium tellurium (GeSeTe) or a charcogenide.

The switch element 104 includes a first side 114 and a second side 116. The first side 114 connects to one of word lines 118, such as a word line-1 through word line-1024, of the memory system 100. The second side 116 connects to the gate terminal 108 of the cell transistor 106.

The memory system 100 includes blocks 120 of the word lines 118, as an example, of thirty two per each of the blocks 120. Each of the blocks 120 includes block selects 122 and a reference source 124, such as a ground, a voltage source, or a reference voltage, which is only connected to the sources 112 of the memory cells 102. Bit lines 126 connect to each of the blocks 120 at the drains 110 of the memory cells 102.

The configuration of the memory system 100 is similar in structure to a NAND type memory (not shown) with the memory cells 102 connected in series 128 in each of the blocks 120. The memory cells 102 adjacent to another form the series 128 with the source terminal 112 of one connected to the drain terminal 110 of the adjacent one.

Both ends of the series 128 connect to a select transistor 130, such as a JFET. One of the block selects 122 connect to a select gate 132 of the select transistor 130. The select transistor 130 connected to the reference source 124 serves as a control gate for connecting the series 128 and the reference source 124, such as a ground. The select transistor 130, at the other end of the series 128, also serves as a control gate for connecting the series 128 and one of the bit lines 126. The cell transistor 106, JFETs, in the series 128 is depletion type with the drain-source current adjusted or controlled by the voltage from the switch element 104 on the gate terminal 108.

For illustrative purpose, the switch element 104 is shown as a MIM capacitor, although it is understood that the switch element 104 may be other resistive changing device. Also for illustrative purpose, the configuration of the memory system 100 is shown as having the bit lines from 1 to 1024, although it is understood that the number of the bit lines 126 may differ. Further for illustrative purpose, the number of the word lines 118 and the number in each of the blocks 120 are 1024 and 32, respectively, although it is understood that the number may differ for both.

Figure 2:
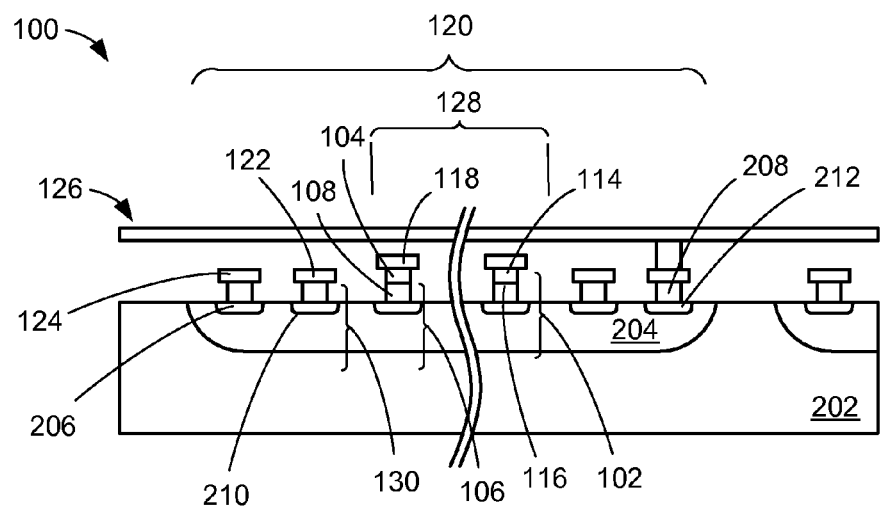
FIG. 2 is a cross-sectional view of the memory system.

Referring now to FIG. 2, therein is shown a cross-sectional view of the memory system 100. The cross-sectional view shows one of the blocks 120 of the memory system 100 and the reference source 124 of one of the blocks 120. The memory system 100 is formed with a substrate 202, such as a silicon p-type substrate. A well 204, such as an n-type well, is formed in the substrate 202 creating a tunnel, such as an n-region buried channel.

A first ohmic contact 206, such as an n+ region, for the reference source 124 is formed in the well 204 at one end of the series 128. A first plug 208 connects the reference source 124 and the first ohmic contact 206. The select transistor 130 is formed next to the first ohmic contact 206 with a junction gate 210, such as a p+ region, formed in the well 204. The first plug 208 connects the junction gate 210 and one of the block selects 122.

One of the memory cells 102 is formed next to the select transistor 130 with the gate terminal 108, such as a p+ region, formed in the well 204. The first plug 208 is optional and connects the second side 116 of the switch element 104 and the gate terminal 108. The switch element 104 and the gate terminal 108 may connect without the first plug 208. The first side 114 of the switch element 104 connects with a predetermined instance of the word lines 118.

At the other end of the series 128, another of the memory cells 102 is next to the select transistor 130 connected to one of the bit lines 126. One of the bit lines 126 connects to the well 204 with a second ohmic contact 212 in the well 204, such as an n+ region. The n+ region in the well 204 may form the ohmic contacts for the source and the drain of the JFETs, such as the select transistor 130 or the cell transistor 106.

Figure 3:
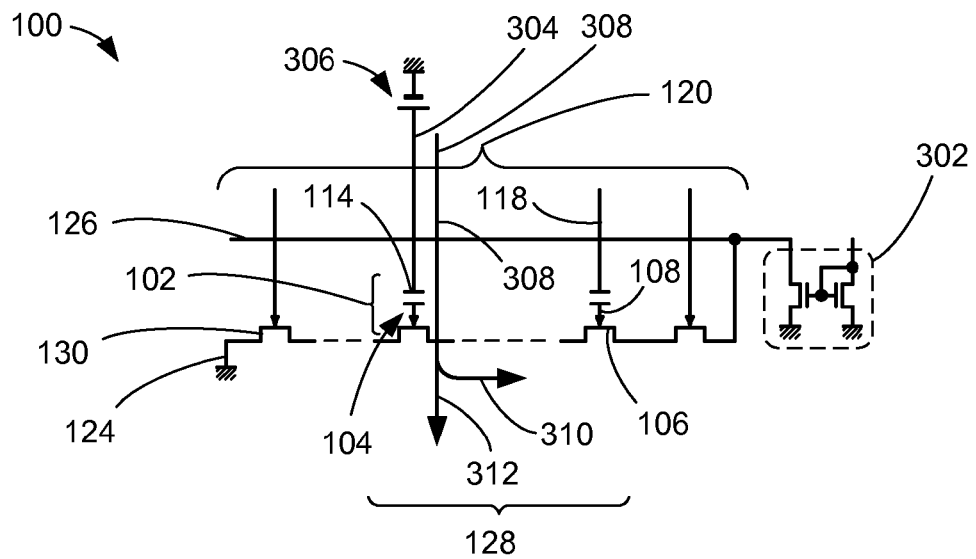
FIG. 3 is a more detailed schematic view of the memory system in a program phase.

Referring now to FIG. 3, therein is shown a more detailed schematic view of the memory system in a program phase. One of the blocks 120 has one end of the series 128 connected to one of the bit lines 126 and a sense circuit 302. The sense circuit 302 functions as a current source or limiter for read, write (or program), and erase operation of the memory system 100. As described earlier, the series 128 has the select transistor 130 at each end.

To program data into the memory cells 102, a selected word line 304, one of the word lines 118, helps select the location of the memory cells 102. A voltage source 306 provides a voltage level $V_1$ on the selected word line 304 and to the first side 114 of the switch element 104 connected to the selected word line 304. For example, $V_1$ may be 3 volts for programming the switch element 104. A high voltage level programs the memory cells 102, selected. Non-selected portions of the series 128 have the word lines 118, connected to the memory cells 102 not selected, providing a ground potential.

The select transistor 130 connected to the reference source 124 is "off". The select transistor 130 connected to one of the bit lines 126 is "on". With the voltage source 306 set to $V_1$, the switch element 104 turns "on" conducting a programming current 308 through the switch element 104.

The programming current 308 flows to the cell transistor 106 and splits into multiple current paths, a base current 310 and a collector current 312. The base current 310 flows through the p-n junction of the gate terminal 108, p+ region, and the well 204 of FIG. 2, such as an n-type channel, to the sense circuit 302, functioning as a current source or current limiter.

The cell transistor 106 connected to the selected word line 304 has a current gain such that the collector current 312 is equivalent to the base current 310 multiplied by 10 or 100. The collector current 312 goes through the substrate 202 of FIG. 2, wherein the substrate 202 is tied to ground. Since the majority of the programming current 308 flows from the gate terminal 108 to ground, if the select transistor 130 connected to the reference source 124 is turned "on", all the memory cells 102 connected to the selected word line 304 would be programmed inadvertently.

In order to selectively program the series 128, the sense circuit 302 is turned "on" serving as a current source controlling the current on the bit lines 126 to a value of $I_1$. The memory cells 102 sharing the selected word line 304 will not be programmed if the sense circuit 302 is "off" for the series 128, not selected. The sense circuit 302 in the "off" state means that no current flows towards it. Without the base current 310, the collector current 312 does not flow into the substrate 202. Without the base current 310 and the collector current 312 in the series 128, not selected, the programming current 308 does not flow through the switch element 104 for programming.

Figure 4:
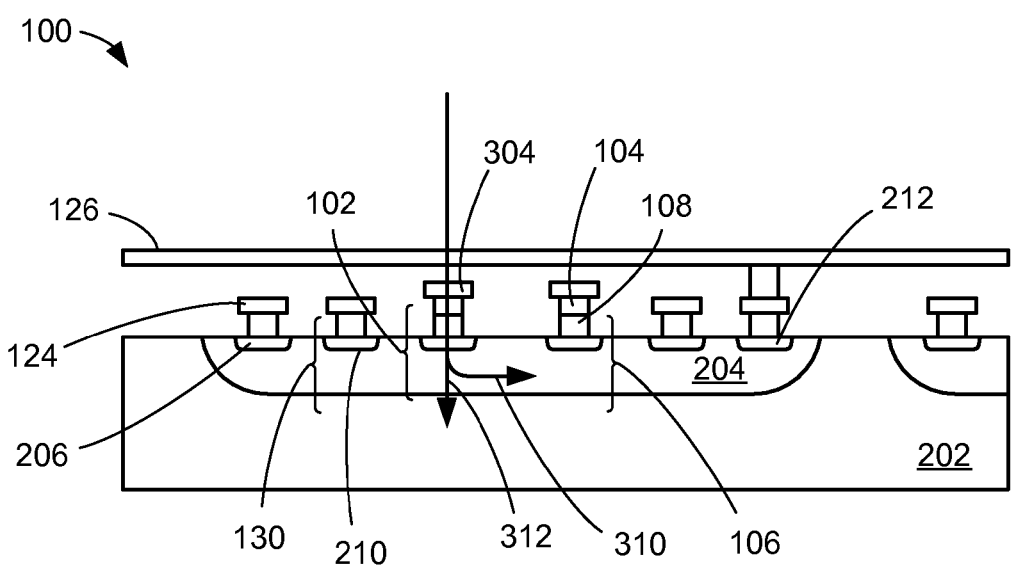
FIG. 4 is the cross-sectional view of the memory system in the program phase.

Referring now to FIG. 4, therein is shown the cross-sectional view of the memory system in the program phase. The cross-sectional view is also shown in FIG. 2 with the addition of the current flows in the memory system 100 for the program or the write operation.

To program the instance of the memory cells 102 connected to the selected word line 304, the select transistor 130 next to the reference source 124 and the first ohmic contact 206 is turned "off" while the select transistor 130 connected one of the bit lines 126 is turned "on". As the voltage source 306 of FIG. 3 is set to $V_1$ for programming, the cell transistor 106 connected to the selected word line 304 functions as a bipolar pnp transistor with the junction gate 210 functions as an emitter, the well 204 as the base, and the substrate 202 as the collector.

Current flows from the voltage source 306 through the switch element 104 of the selected word line 304. The current continues to flow through the gate terminal 108 and the junction gate 210. The current splits into the base current 310 and the collector current 312. The collector current 312 flows from the gate terminal 108 through the well 204 and the substrate 202, wherein the substrate 202 is tied to ground. The base current 310 flows in the well 204 to the second ohmic contact 212. From the second ohmic contact 212, the base current 310 flows through the select transistor 130 to the attached instance of the bit lines 126 towards the sense circuit 302 of FIG. 3, serving as a current limiter.

For illustrative purpose, the cell transistor 106 and the select transistor 130 are shown as a junction field effect transistor with a vertical pnp structure, although it is understood that the cell transistor 106, the select transistor 130, or both may be other transistor types, such as a Schottky gate field effect transistor. For example, the cell transistor 106 may be a Schottky gate field effect transistor without the vertical pnp transistor structure but a metal-n-p structure.

The Schottky gate field effect transistor with the metal-n-p structure has the gate terminal 108, such as a metal, in contact with the well 204, such as an n-type well, and the well 204 in contact with the substrate 202, such as a p-type substrate, without the junction gate 210, such as a p-type junction. This structure creates the cell transistor 106 as a bipolar transistor with the current gain approximately unity. As a result, the programming current 308 of FIG. 3 mostly flows from the gate terminal 108 to the well 204, such as an n-channel, not penetrating into the substrate 202 because minority carriers which are the origin of the collector current 312 are not injected from the gate terminal 108.

Figure 5:
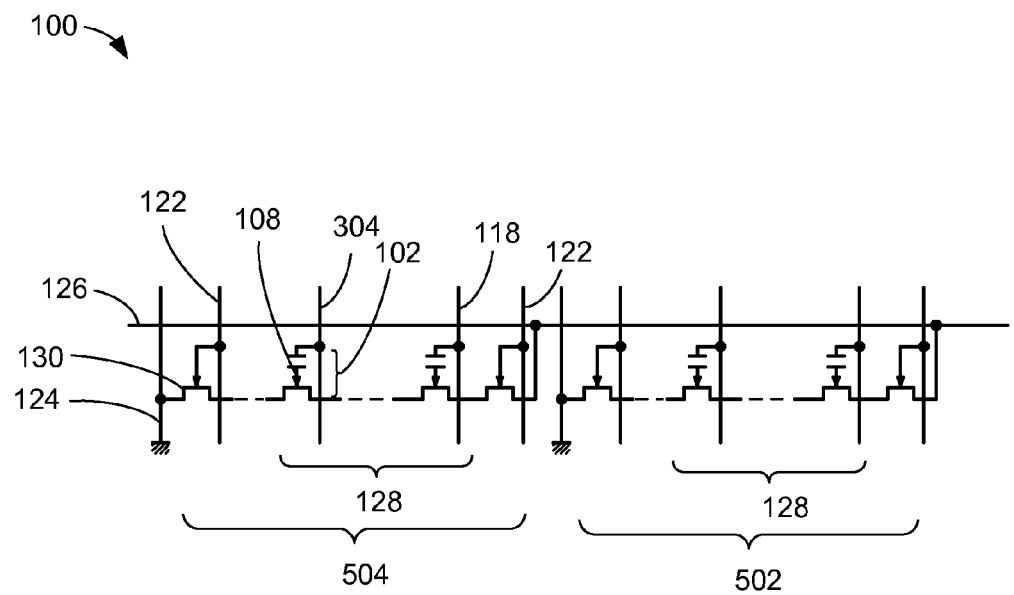
FIG. 5 is another detailed schematic view of the memory system in the program phase.

Referring now to FIG. 5, therein is shown another detailed schematic view of the memory system 100 in the program phase. This view depicts programming bias conditions for a non-selected block 502 and a selected block 504 of the memory system 100.

In the selected block 504, the select transistor 130 connected to the reference source 124 is turned "off" and the connected instance of the block selects 122 providing a $-V_1$ voltage level, such as −3 volts, applied to the gate terminal 108. It is understood that other negative voltage level may be applied to turn "off" the select transistor 130. The selected word line 304 has $V_1$ voltage level applied to select one of the memory cells 102 in the selected block 504. The word lines 118 provide ground potential for the memory cells 102, not selected, in the selected block 504. The select transistor 130 connected to one of the bit lines 126 is "on" with the gate terminal 108 at ground potential provided by the other instance of the block selects 122. These bias conditions allow the programming current 308 of FIG. 3 to flow from the selected word line 304 to the instance of the bit lines 126 and towards the sense circuit 302 of FIG. 3.

In the non-selected block 502, the select transistor 130 at both ends of the series 128 are "off" with the block selects 122 at both ends providing $-V_1$ voltage level, such as −3 volts. It is understood that other negative voltage level may be applied to turn "off" the select transistor 130. The memory cells 102 in the non-selected block 502 are not selected, the word lines 118 in the non-selected block 502 provide ground potential. The non-selected block 502 does not provide current to the sense circuit 302.

Figure 6:
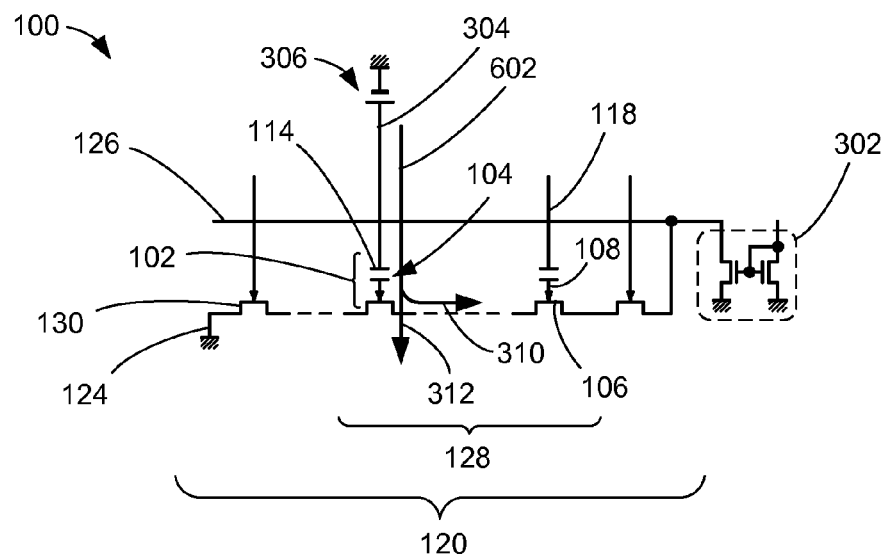
FIG. 6 is a more detailed schematic view of the memory system in an erase phase.

Referring now to FIG. 6, therein is shown a more detailed schematic view of the memory system 100 in an erase phase. As shown in FIG. 3, one of the blocks 120 has one end of the series 128 connected to one of the bit lines 126 and the sense circuit 302. The sense circuit 302 functions as a current source or limiter for read, write (or program), and erase operation of the memory system 100. As described earlier, the series 128 has the select transistor 130 at each end.

To erase data, the selected word line 304 helps select the location of the memory cells 102. The voltage source 306 provides a voltage level $V_2$ on the selected word line 304 and to the first side 114 of the switch element 104 connected to the selected word line 304. The erase voltage value $V_2$ is less than the program voltage value $V_1$. For example, $V_2$ may be 1.2 volts for erasing the switch element 104. The non-selected portions of the series 128 have the word lines 118, connected to the memory cells 102 not selected, providing a ground potential.

The select transistor 130 connected to the reference source 124 is "off". The select transistor 130 connected to one of the bit lines 126 is "on". With the voltage source 306 set to $V_2$, the switch element 104 turns "on" conducting an erasing current 602 through the switch element 104. The erasing current 602 flows to the cell transistor 106 and splits into multiple current paths, the base current 310 and the collector current 312. The base current 310 flows through the p-n junction of the gate terminal 108, p+ region, and the well 204 of FIG. 2, such as an n-type channel, to the sense circuit functioning as a current source or current limiter.

The cell transistor 106 connected to the selected word line 304 has a current gain such that the collector current 312 is equivalent to the base current 310 multiplied by 10 or 100. The collector current 312 goes through the substrate 202 of FIG. 2, wherein the substrate 202 is tied to ground. Since the majority of the erasing current 602 flows from the gate terminal 108 to ground, if the select transistor 130 connected to the reference source 124 is turned "on", all the memory cells 102 connected to the selected word line 304 would be erased inadvertently.

In order to selectively erase the series 128, the sense circuit 302 is turned "on" serving as a current source controlling the current on the bit lines 126 to a value of $I_1$. The erasing current 602 at $I_2$ is higher than the programming current 308 of FIG. 3 at $I_1$. The high current value on the bit lines 126 erases the memory cells 102 that are selected. The memory cells 102 sharing the selected word line 304 will not be erased with the sense circuit 302 is "off" for the series 128, not selected. The sense circuit 302 in the "off" state means that no current flows towards it. Without the base current 310, the collector current 312 does not flow into the substrate 202. Without the base current 310 and the collector current 312 in the series 128, not selected, the erasing current 602 does not flow through the switch element 104 for erasing.

Figure 7:
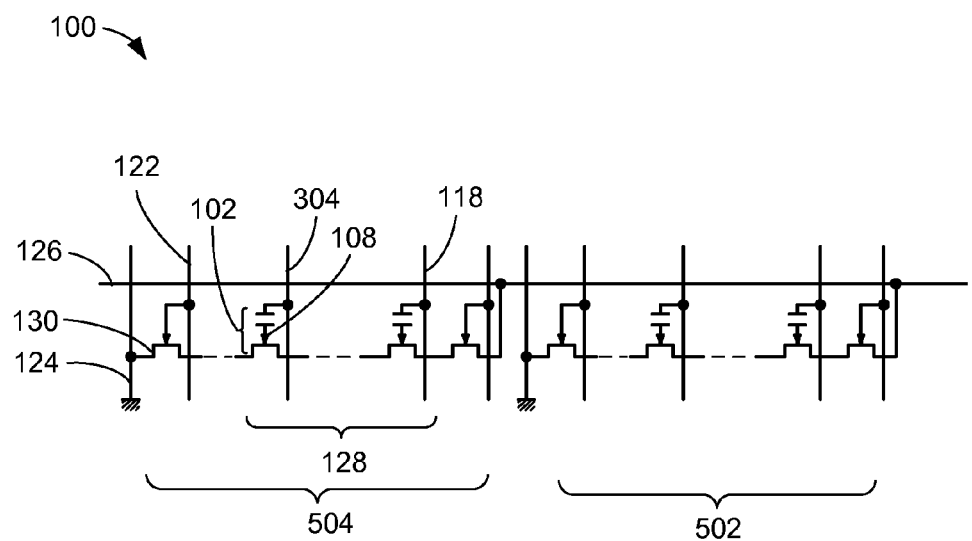
FIG. 7 is another detailed schematic view of the memory system in the erase phase.

Referring now to FIG. 7, therein is shown another detailed schematic view of the memory system 100 in the erase phase. This view depicts erasing bias conditions for the non-selected block 502 and the selected block 504 of the memory system 100.

In the selected block 504, the select transistor 130 connected to the reference source 124 is turned "off" and the connected instance of the block selects 122 providing a $-V_1$ voltage level, such as −3 volts, applied to the gate terminal 108. It is understood that other negative voltage level may be applied to turn "off" the select transistor 130. The selected word line 304 has $V_2$ voltage level, 1.2 volts, applied to select one of the memory cells 102 in the selected block 504. The word lines 118 provide ground potential for the memory cells 102, not selected, in the selected block 504. The select transistor 130 connected to one of the bit lines 126 is "on" with the gate terminal 108 at ground potential provided by the other instance of the block selects 122. These bias conditions allow the erasing current 602 of FIG. 6 to flow from the selected word line 304 to the instance of the bit lines 126 and towards the sense circuit 302 of FIG. 3.

In the non-selected block 502, the select transistor 130 at both ends of the series 128 are "off" with the block selects 122 at both ends providing $-V_1$ voltage level, such as −3 volts. It is understood that other negative voltage level may be applied to turn "off" the select transistor 130. The memory cells 102 in the non-selected block 502 are not selected, the word lines 118 in the non-selected block 502 provide ground potential. The non-selected block 502 does not provide current to the sense circuit 302.

Figure 8:
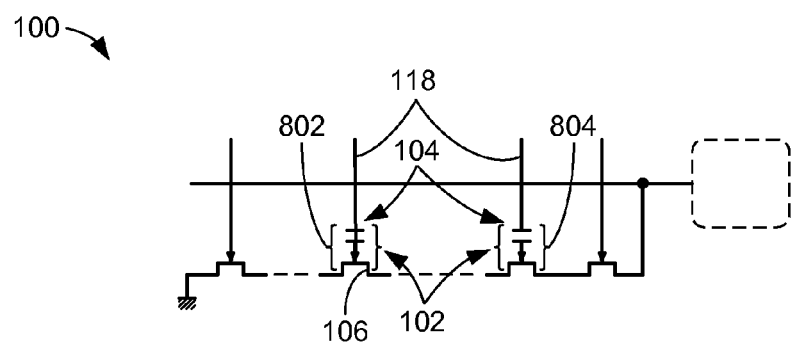
FIG. 8 is a more detailed schematic view of the memory system in a read phase.

Referring now to FIG. 8, therein is shown a more detailed schematic view of the memory system 100 in a read phase. This view depicts the switch element 104 in the memory cells 102 that are programmed or erased. For a read operation, the selected locations for reading have the word lines 118 providing a negative voltage level, such as $-V_1$ or −3 volts. A programmed cell 802 is one of the memory cells 102 that have been programmed. An erased cell 804 is one of the memory cells 102 that have been erased.

The programmed cell 802 includes the switch element 104, programmed, and is "on" conducting current. The switch element 104 in the "on" state electrically connects with the cell transistor 106. For the erased cell 804 or one of the memory cells 102 that has not been programmed, the switch element 104 functions as a capacitor.

Figure 9:
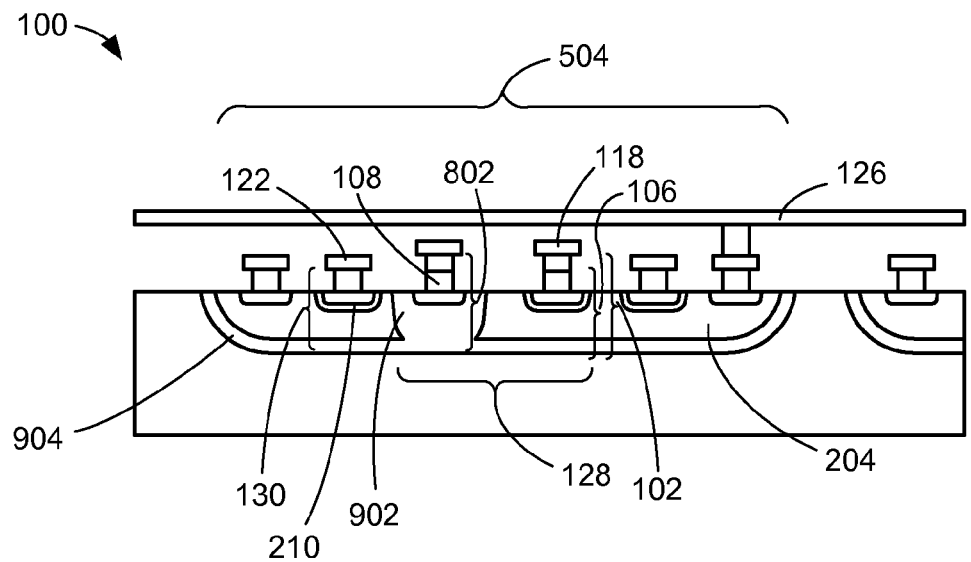
FIG. 9 is the cross-sectional view of the memory system in the read phase of the programmed cell.

Referring now to FIG. 9, therein is shown the cross-sectional view of the memory system 100 in the read phase of the programmed cell 802. For the read operation, the selected locations for reading have the word lines 118 providing a negative voltage level, such as $-V_1$ or −3 volts. Also, the selected block 504 has the block selects 122 on both ends of the series 128 providing the ground potential to the select transistor 130 on each end. The non-selected locations have the word lines 118 providing a ground potential while the block selects 122 on both ends of the series 128 provides a negative voltage level, such as $-V_1$ or −3 volts. The negative read voltage forms a depletion region 902.

The programmed cell 802 expands the depletion region 902 to the end of the well 204 into a D-portion 904 as well as pinch off the well 204. The depletion region 902 blocks the lateral current flow in the well 204. Also, the programmed cell 802 does not conduct current to ground.

The negative read voltage applied to the cell transistor 106 of the programmed cell 802 creates an offset from reverse biasing the junction gate of the cell transistor 106, selected for read. The reverse bias impedes current flow effectively turning "off" the cell transistor 106. Current from the bit lines 126 does not flow through the cell transistor 106, selected. The blocked current allows the sense circuit 302 of FIG. 3 to determine a "1" value stored in this instance of the memory cells 102.

For illustrative purpose, the cell transistor 106 is shown as a junction field effect transistor with a vertical pnp structure, although it is understood that the cell transistor 106, may be other transistor types, such as a Schottky gate field effect transistor. For example, the cell transistor 106 may be a Schottky gate field effect transistor without the vertical pnp transistor structure but a metal-n-p structure.

The Schottky gate field effect transistor with the metal-n-p structure has the gate terminal 108, such as a metal, in contact with the well 204, such as an n-type well, and the well 204 in contact with the substrate 202, such as a p-type substrate, without the junction gate 210, such as a p-type junction. This structure creates the cell transistor 106 as a bipolar transistor with the current gain approximately unity. The depletion region 902 spread around the gate terminal 108, such as a metal, similar to the junction gate 210, such as a p-type junction, of the junction field effect transistor.

Figure 10:
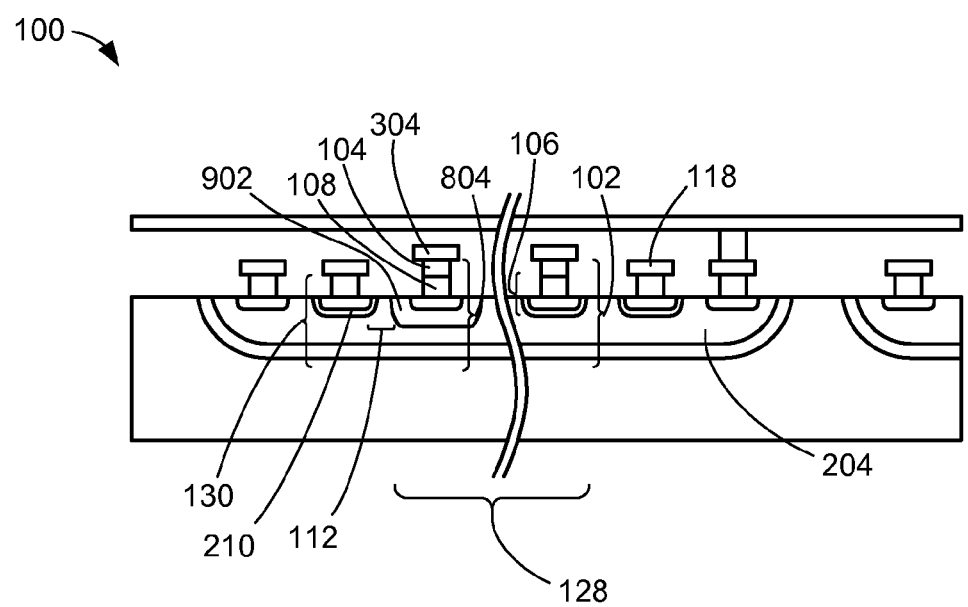
FIG. 10 is the cross-sectional view of the memory system in the read phase of the erased cell.

Referring now to FIG. 10, therein is shown the cross-sectional view of the memory system 100 in the read phase of the erased cell 804. This view depicts the switch element 104 in the memory cells 102 that are programmed or erased. For a read operation, the selected locations for reading have the word lines 118 providing a negative voltage level, such as $-V_1$ or −3 volts. The non-selected locations have the word lines 118 providing a ground potential. The negative read voltage forms the depletion region 902.

For the erased cell 804 or one of the memory cells 102 that has not been programmed, the switch element 104 functions as a capacitor. The negative read voltage applied to the erased cell 804 or a non-programmed cell forms a voltage on the junction gate 210 resulting from the capacitive coupling of the capacitance of the switch element 104 and an adjacent parasitic capacitance between the gate terminal 108 and the source terminal 112. For this example where the cell transistor 106 is a JFET and the junction gate 210 is a p+ region with the well 204 as an n-region, the negative read voltage creates the depletion region 902 forming the adjacent parasitic capacitance.

If C1 is the capacitance of the switch element 104 and C2 is the parasitic junction capacitance formed by the depletion region 902, the voltage at the junction gate 210 or the gate terminal 108 has a voltage division by C1/(C1+C2) of the negative read voltage. If C1 is very large compared to C2, the voltage division is very minimal. If C1 is very small compared to C2, the voltage division is large.

In a typical case, as an example, C1 and C2 values are approximate equal. The voltage swing at the junction gate 210 for the erased cell 804 is about half compared to the programmed cell 802 of FIG. 8, having internal direct electrical connection between the switch element 104 and the cell transistor 106. Also, the voltage at the gate terminal 108 for the erased cell 804 is higher compared to the programmed cell 802. The voltage is slightly negative from the capacitive coupling between the selected word line 304 and the junction gate 210, floating. The well 204 still conducts allowing current to flow to ground through the select transistor 130 on both ends of the series 128.

Adjusting the switch element 104 or the voltage at the gate terminal 108 adjusts the cell transistor 106, JFET, to be conductive. If the cell transistor 106 has a path to ground, current will flow allowing the sense circuit 302 of FIG. 3 to determine the erased or non-programmed condition.

For illustrative purpose, the cell transistor 106 is shown as a junction field effect transistor with a vertical pnp structure, although it is understood that the cell transistor 106, may be other transistor types, such as a Schottky gate field effect transistor. For example, the cell transistor 106 may be a Schottky gate field effect transistor without the vertical pnp transistor structure but a metal-n-p structure.

The Schottky gate field effect transistor with the metal-n-p structure has the gate terminal 108, such as a metal, in contact with the well 204, such as an n-type well, and the well 204 in contact with the substrate 202, such as a p-type substrate, without the junction gate 210, such as a p-type junction. This structure creates the cell transistor 106 as a bipolar transistor with the current gain approximately unity. The depletion region 902 spread around the gate terminal 108, such as a metal, similar to the junction gate 210, such as a p-type junction, of the junction field effect transistor.

Figure 11:
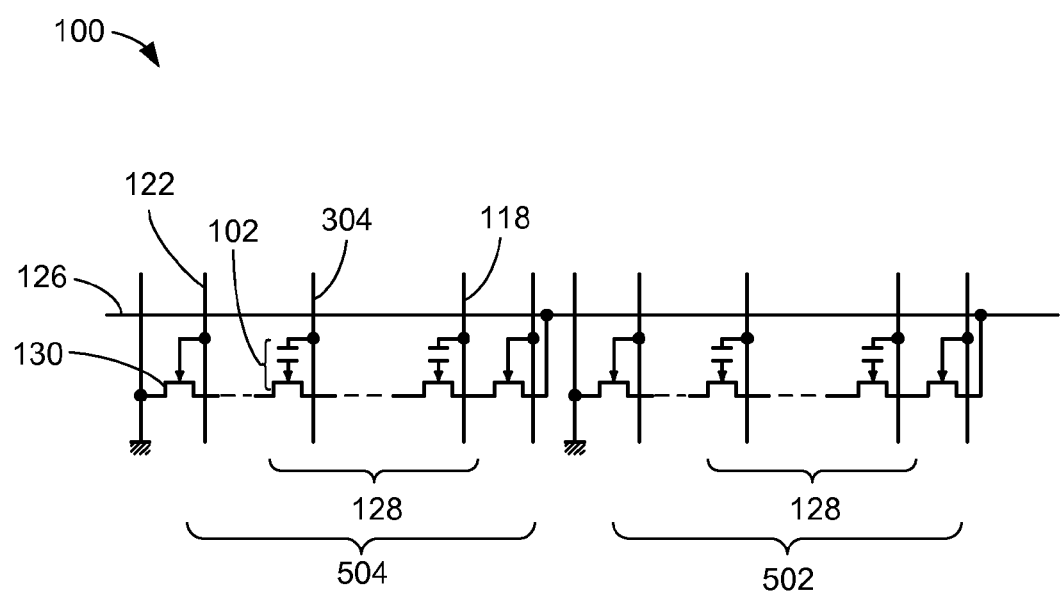
FIG. 11 is another detailed schematic view of the memory system in the read phase.

Referring now to FIG. 11, therein is shown another detailed schematic view of the memory system 100 in the read phase. This view depicts read bias conditions for the non-selected block 502 and the selected block 504 of the memory system 100.

In the selected block 504, the select transistor 130 is turned "on" at both ends of the series 128 and the connected instance of the block selects 122 providing the ground potential. It is understood that other voltage level may be applied to turn "on" the select transistor 130. The selected word line 304 has $-V_1$ voltage level, such as −3 volts, applied to select one of the memory cells 102 in the selected block 504. The word lines 118 provide ground potential for the memory cells 102, not selected, in the selected block 504. These bias conditions allow sensing current flow from the selected word line 304 to the instance of the bit lines 126 and towards the sense circuit 302 shown in FIG. 3.

In the non-selected block 502, the select transistor 130 at both ends of the series 128 are "off" with the block selects 122 at both ends providing $-V_1$ voltage level, such as −3 volts. It is understood that other negative voltage level may be applied to turn "off" the select transistor 130. The memory cells 102 in the non-selected block 502 are not selected, the word lines 118 in the non-selected block 502 provide ground potential. The non-selected block 502 does not provide current to the sense circuit 302 of FIG. 3.

Figure 12:
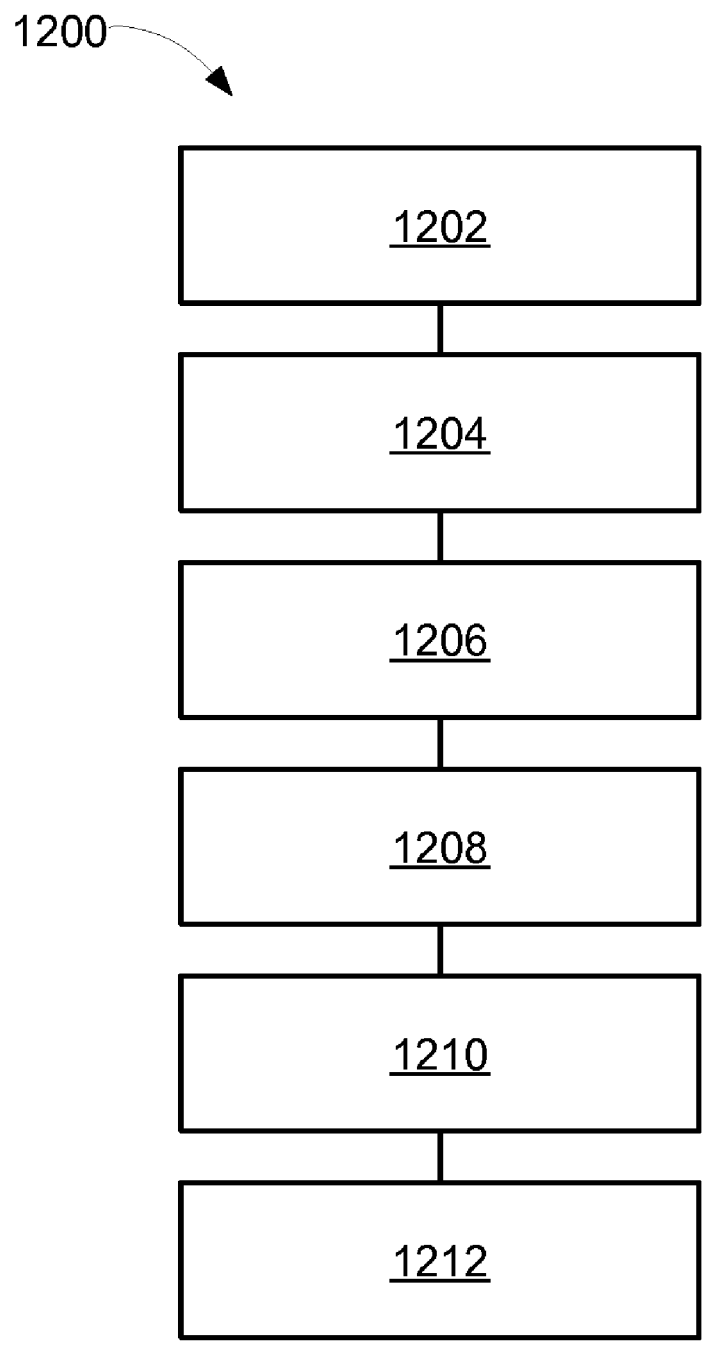
FIG. 12 is a flow chart of a memory system for manufacture of the memory system in an embodiment of the present invention.

Referring now to FIG. 12, therein is shown a flow chart of a memory system 1200 for manufacture of the memory system 100 in an embodiment of the present invention. The system 1200 includes forming a switch element having a first side and a second side in a block 1202; forming a cell transistor having a gate terminal in a block 1204; forming a memory cell, having the switch element and the cell transistor, with the gate terminal connected to the second side in a block 1206; connecting a word line and the memory cell at the first side in a block 1208; connecting a bit line and the memory cell in a block 1210; and connecting a reference source and the memory cell in a block 1212.

It has been discovered that the present invention thus has numerous aspects.

It has been discovered that the present invention provides the connection of MIM switch cell, or other resistive changing device, to the gate terminal of the JFET improves memory density, lowers power consumption, reduces memory size, increases reliability, and lowers cost of the memory system.

An aspect is that the present invention provides that the switch cell may be turned "on" by high voltage with low current and turned off by low voltage with high current. The voltage and current requirements are sufficiently low and scale with smaller semiconductor geometry processes.

Another aspect of the present invention is that a JFET is used in the memory cells as well as for the block selection transistors. The JFET can conduct the required current without the size penalty of MOSFET.

Yet another aspect of the present invention provides the JFET in the memory cell has a depletion region for the selected memory cell. The depth of the depletion region depends on the memory cell programmed or erase/non-programmed. This depth controls the amount of current sensed during read operation to determine programmed or erased/non-programmed condition.

Yet another aspect of the present invention has a sense circuit per block connected to each bit line. Each of these sense circuits may be turned "off" or "on" to program or erase selected memory cells or not to select the memory cells to prevent inadvertent program or erase.

Yet another aspect of the present invention has the performance for fast random access needed for program code storage. The lower voltage and current requirements allows the memory cells to respond faster than memory cells requiring device structures to tolerate higher voltage level, such as 18 volts.

Thus, it has been discovered that the memory system method of the present invention furnishes important and heretofore unknown and unavailable solutions, capabilities, and functional aspects for improving yield, reliability, scalability, and cost in systems. The resulting processes and configurations are straightforward, cost-effective, uncomplicated, highly versatile and effective, can be implemented by adapting known technologies, and are thus readily suited for efficiently and economically manufacturing stacked integrated circuit package-in-package devices.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method for manufacturing a memory system comprising:
   forming a switch element with resistive change having a first side and a second side;
   forming a cell transistor having a gate terminal, the cell transistor is a junction field effect transistor;
   forming a memory cell, having the switch element and the cell transistor, with the gate terminal connected to the second side, the memory cell is a resistive change memory cell;
   connecting a word line and the memory cell at the first side, including connecting a voltage source to the word line, the voltage source provides a negative voltage value;
   connecting a bit line and the memory cell, the bit line provides a current path; and
   connecting a reference source only to a source of the memory cell, the reference source is a reference voltage.

2. The method as claimed in claim 1 further comprising connecting a sense circuit and the bit line.

3. The method as claimed in claim 1 wherein connecting the bit line and the memory cell includes:
   connecting a select transistor between the memory cell and the bit line; and
   connecting a block select to a select gate of the select transistor.

4. The method as claimed in claim 1 wherein connecting the reference source and the memory cell includes:
   connecting a select transistor between the memory cell and the reference source; and
   connecting a block select to a select gate of the select transistor.

5. The method as claimed in claim 1 wherein forming the cell transistor is the junction field effect transistor or a Schotty gate field effect transistor.

6. The method as claimed in claim 1 further comprising setting the switch element to a state comprises:
   turning the switch element to an "on" state with a high voltage $V_1$ and a low current $I_1$; and
   turning the switch element to an "off" state with a low voltage $V_2$ and a high current $I_2$.

7. The method as claimed in claim 1 further comprising programming the memory cell comprises:
   connecting a voltage source to the word line, the voltage source provides a voltage value $V_1$; and
   connecting a sense circuit and the bit line, the sense circuit is turned "on" with current value of $I_1$.

8. The method as claimed in claim 1 further comprising erasing the memory cell comprises:
   connecting a voltage source to the word line, the voltage source provides a voltage value $V_2$; and
   connecting a sense circuit and the bit line, the sense circuit is turned "on" with current value of $I_2$.

9. A memory system comprising:
   a switch element with resistive change having a first side and a second side;
   a cell transistor having a gate terminal is a junction field effect transistor;
   a memory cell, having the switch element and the cell transistor, with the gate terminal connected to the second side is a resistive change memory cell;
   a voltage source connected to a word line connected with the memory cell at the first side, the voltage source provides a negative voltage value;
   a bit line connected with the memory cell provides a current path; and
   a reference source connected with only a source of the memory cell is a reference voltage.

10. The system as claimed in claim 9 further comprising a sense circuit connected with the bit line.

11. The system as claimed in claim 9 wherein the bit line connected with the memory cell includes:
    a select transistor between the memory cell and the bit line; and
    a block select connected to a select gate of the select transistor.

12. The system as claimed in claim 9 wherein the reference source connected with the memory cell includes:
    a select transistor between the memory cell and the reference source; and
    a block select connected to a select gate of the select transistor.

13. The system as claimed in claim 9 wherein the cell transistor is the junction field effect transistor or a Schotty gate field effect transistor.

14. The system as claimed in claim 9 wherein the switch element is responsive to:
    an "on" state with the word line provided a high voltage $V_1$ and a low current $I_1$; and
    an "off" state with the word line provided a low voltage $V_2$ and a high current $I_2$.

15. The system as claimed in claim 9 wherein the memory cell is programmed by:
    a voltage source connected to the word line, the voltage source provides a voltage value $V_1$; and
    a sense circuit connected with the bit line, the sense circuit is turned "on" with current value of $I_1$.

16. The system as claimed in claim 9 wherein the memory cell is erased by:
    a voltage source connected to the word line, the voltage source provides a voltage value $V_2$; and
    a sense circuit connected with the bit line, the sense circuit is turned "on" with current value of $I_2$.

17. A method for manufacturing a memory system comprising:
    forming a metal-insulator-metal element having a first side and a second side;
    forming a junction field effect transistor having a gate terminal, a source terminal, and a drain terminal;
    forming a memory cell, having the metal-insulator-metal element and the junction field effect transistor, with the gate terminal connected to the second side;
    connecting a word line and the memory cell at the first side, including connecting a voltage source to the word line, the voltage source provides a negative voltage value;
    connecting a bit line and the memory cell with the junction field effect transistor, wherein the junction field effect transistor has a first block select connected to the gate terminal, the source terminal connected to the memory cell, and the drain terminal connected to the bit line;

connecting a ground only to the source terminal of the junction field effect transistor of the memory cell wherein the junction field effect transistor has a second block select connected to the gate terminal, the source terminal connected to the ground, and the drain terminal connected to the memory cell; and connecting a sense circuit and the bit line.

18. The method as claimed in claim 17 further comprising programming the memory cell comprises:

connecting a voltage source to the word line, the voltage source provides a voltage value $V_1$;

connecting the voltage source to the first block select, the voltage source provides a ground potential;

connecting the voltage source to the second block select, the voltage source provides a negative voltage value; and turning the sense circuit "on" with current value of $I_1$.

19. The method as claimed in claim 17 further comprising erasing the memory cell comprises:

connecting a voltage source to the word line, the voltage source provides a voltage value $V_2$;

connecting the voltage source to the first block select, the voltage source provides a ground potential;

connecting the voltage source to the second block select, the voltage source provides a negative voltage value; and turning the sense circuit "on" with current value of $I_2$.

20. The method as claimed in claim 17 further comprising reading the memory cell comprises:

connecting a voltage source to the word line, the voltage source provides a negative voltage value;

connecting the voltage source to the first block select and the second block select, the voltage source provides a ground potential; and turning the sense circuit "on".

21. The method as claimed in claim 17 further comprising protecting the memory cell comprises turning the sense circuit "off".

22. A memory system comprising:

a metal-insulator-metal element having a first side and a second side;

a junction field effect transistor having a gate terminal, a source terminal, and a drain terminal;

a memory cell, having the metal-insulator-metal element and the junction field effect transistor, with the gate terminal connected to the second side;

a word line connected to the memory cell at the first side, a voltage source connected to the word line, the voltage source provides a negative voltage value;

a bit line connected to the memory cell with the junction field effect transistor, wherein the junction field effect transistor has a first block select connected to the gate terminal, the source terminal connected to the memory cell, and the drain terminal connected to the bit line;

a ground only to the source terminal of the junction field effect transistor of the memory cell wherein the junction field effect transistor has a second block select connected to the gate terminal, the source terminal connected to the ground, and the drain terminal connected to the memory cell; and a sense circuit connected to the bit line.

23. The system as claimed in claim 22 wherein the memory cell is programmed by:

a voltage source connected to the word line, the voltage source provides a voltage value $V_1$;

the voltage source connected to the first block select, the voltage source provides a ground potential;

the voltage source connected to the second block select, the voltage source provides a negative voltage value; and the sense circuit turned "on" with current value of $I_1$.

24. The system as claimed in claim 22 further comprising the memory cell is erased by:

a voltage source connected to the word line, the voltage source provides a voltage value $V_2$;

the voltage source connected to the first block select, the voltage source provides a ground potential;

the voltage source connected to the second block select, the voltage source provides a negative voltage value; and the sense circuit turned "on" with current value of $I_2$.

25. The system as claimed in claim 22 further comprising the memory cell is read by:

a voltage source connected to the word line, the voltage source provides a negative voltage value;

the voltage source connected to the first block select and the second block select, the voltage source provides a ground potential; and the sense circuit turned "on".

26. The system as claimed in claim 22 further comprising the memory cell is protected by the sense circuit turned "off".

* * * * *